(12) United States Patent
Baldwin

(10) Patent No.: US 6,253,365 B1
(45) Date of Patent: Jun. 26, 2001

(54) AUTOMATED DESIGN SYSTEM FOR DIGITAL CIRCUITS

(76) Inventor: David P. Baldwin, 95 Harryel St., Pittsfield, MA (US) 01201

(*) Notice: Subject to any disclaimer, the term of this patent is extended or adjusted under 35 U.S.C. 154(b) by 0 days.

(21) Appl. No.: 09/167,645

(22) Filed: Oct. 6, 1998

(51) Int. Cl.[7] .................................................. G06F 17/50
(52) U.S. Cl. .................................. 716/18; 716/2; 703/13
(58) Field of Search ............................. 716/18, 1, 2, 11, 716/8, 9; 703/14, 15, 13

(56) References Cited

U.S. PATENT DOCUMENTS

| | | | |
|---|---|---|---|
| 4,677,587 | * 6/1987 | Zemany, Jr. | 716/20 |
| 4,827,427 | * 5/1989 | Hyduke | 703/14 |
| 4,964,056 | 10/1990 | Bekki et al. | 716/1 |
| 5,394,346 | * 2/1995 | Milsom | 703/14 |
| 5,469,367 | * 11/1995 | Puri et al. | 716/18 |
| 5,544,067 | * 8/1996 | Rostoker et al. | 703/14 |
| 5,572,437 | 11/1996 | Rostoker et al. | 716/18 |
| 5,745,386 | 4/1998 | Wile et al. | 703/15 |
| 5,748,487 | * 5/1998 | Sawasaki et al. | 716/1 |
| 5,805,462 | * 9/1998 | Poirot et al. | 716/18 |
| 5,828,579 | * 10/1998 | Beausang | 716/2 |
| 5,867,396 | * 2/1999 | Parlour et al. | 364/489 |
| 5,867,397 | * 2/1999 | Koza et al. | 703/14 |
| 5,870,308 | * 2/1999 | Dangelo et al. | 716/18 |
| 5,953,235 | * 9/1999 | Gregory et al. | 716/18 |
| 5,974,242 | * 10/1999 | Damarla et al. | 716/2 |
| 6,102,964 | * 8/2000 | Tse et al. | 716/18 |

OTHER PUBLICATIONS

Shi et al., "An Efficient Algorithm for Constrained Encoding and its Applications," IEEE Trans on CAD of ICs & Systems, vol 12, No 12, pp 1813–1826, Dec. 1993.*

Swamy et al., "Minimal Logic Re–Synthesis for Engineering Change," IEEE Int'l Symposium on Circuits & Systems, pp 1596–1599, Jun. 1997.*

Wenstrand et al., "A Manufacturing–oriented Environment for Synthesis of Fabrication Processes," IEEE, pp 376–379, 1989.*

* cited by examiner

Primary Examiner—Matthew Smith
Assistant Examiner—Leigh Marie Garbowski
(74) Attorney, Agent, or Firm—Hamilton, Brook, Smith & Reynolds, P.C.

(57) ABSTRACT

An automated system for designing digital logic from a user input functional specification. The input to the system is a specification that describes the input and output signals of the desired circuit, the type of logic gates and flip-flops to be used, and optional design controls such as "NO GLITCHES". Using a highly-constrained exhaustive search technique and a built-in logic simulator, the system automatically finds the simplest possible circuit that meets the user specification. The output of the system is at least a schematic drawing of the minimal logic circuit. The system is able to design any type of digital logic: combinational, sequential, synchronous or asynchronous.

18 Claims, 8 Drawing Sheets

Permutation Generation & Logic Simulation

Circuit Specification - Signals & Parts

20 — Signal Truth Table
```
IN_OUT_SIGNALS
  IN1  0101
  IN2  0011
  AND  0001
```

22 — Signal Waveform list
```
IN_OUT_SIGNALS
  IN1  _=_=
  IN2  _=_=
  AND  ___=
```

24 — Signal Attributes and Uncertainty States
```
IN_OUT_SIGNALS
  Cp:clk  __==_==_==_==_==_==_==_==_==_=
  J:data  ____==_____==_==_____===
  K:data  _____==____==_==_____===
  Q       xx____rrrr====_____====ffff____=
```

26

| Part | Inputs | Description |
|---|---|---|
| INV* | 1 | Inverter |
| AND* | 2-8 | AND gate |
| OR* | 2-8 | OR gate |
| NAND | 2-8 | NAND gate |
| NOR | 2-8 | NOR gate |
| XOR | 2 | Exclusive OR gate |
| XNOR | 2 | Exclusive NOR gate |
| DFF | 2 | D flip-flop, Positive edge-triggered clocking |
| DFF_C | 3 | DFF plus asynchronous 0-active Clear |
| DFF_CP* | 4 | DFF_C plus asynchronous 0-active Preset |

\* Default Part type

Fig. 2

Circuit Specification - Options

30

| Option | Description |
|---|---|
| FF_2IN_SYNC | DFF flip-flop parts are clocked by a :clk signal. |
| FF_3IN_SYNC | DFF_C flip-flop parts are clocked by a :clk signal. |
| FF_4IN_SYNC | DFF_CP flip-flop parts are clocked by a :clk signal. |
| FF_ALL_SYNC | All D flip-flop parts are clocked by a :clk signal. |
| GATE_LATCH_ALLWD | Cross-coupled gate circuits are allowed. |
| NO_FF_INITIALIZE | All flip-flops are initialized to 'x' instead of '0' or '1'. |
| NO_GLITCHES | All signals in the circuit must be glitch-free. |
| NO_OUTPUT_GLITCH | The OUTPUT signal of the circuit must be glitch-free. |
| OUT_DEDICATED | The OUTPUT signal of the circuit is NOT fed back to any part inputs. |
| OUT_SYNCHRONOUS | The OUTPUT signal of the circuit is driven by a flip-flip clocked by a :clk signal. |
| SOLUTION_FIRST | Stop search after finding the FIRST solution. |
| SOLUTION_SIMPLE* | After finding the FIRST solution, find only solutions that are equally simple. For example, if the FIRST solution has one DFF, reject other solutions that have two or more DFF's. |
| SOLUTION_EQUIV | Equivalent Solutions. Same as SOLUTION_SIMPLE except that additional INV parts are allowed. |
| SOLUTION_ALL | Find ALL solutions (current limit of 10). |
| WAVEFORM_0 | Simulation waveforms not displayed or saved. |
| WAVEFORM_1 | Simulation waveform format #1 - 01rfx. |
| WAVEFORM_2 | Simulation waveform format #2 - _=rfx. |
| WAVEFORM_3* | Simulation waveform format #3 - graphical. |

* Default Option

Fig. 3

Permutation Generation & Logic Simulation

Asynchronous Sequential Circuit
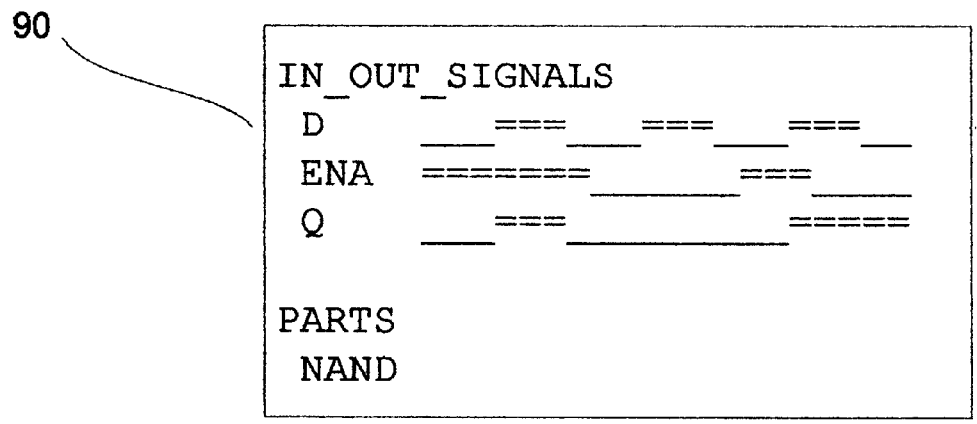
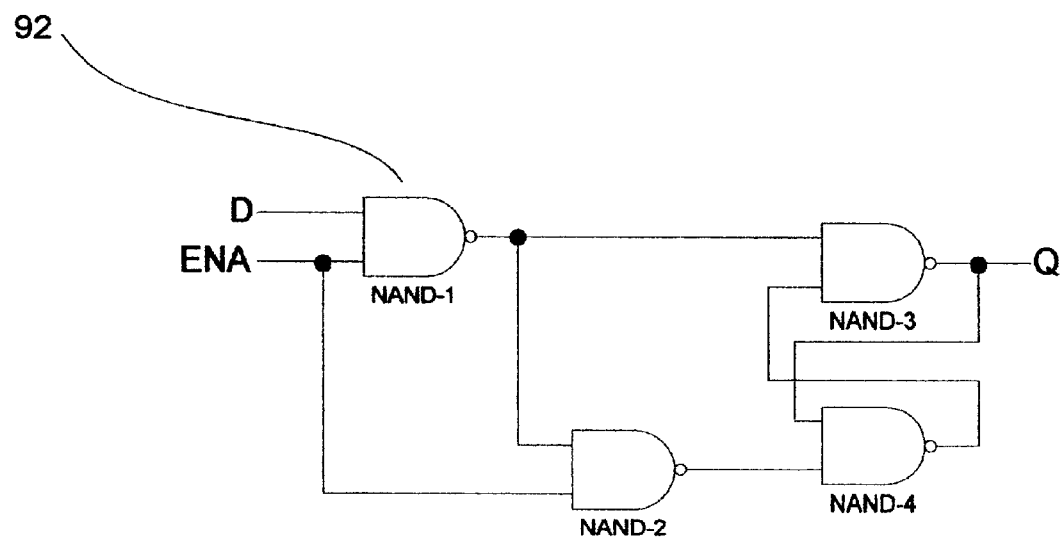
Fig. 7

Synchronous Sequential Circuit

94

```
IN_OUT_SIGNALS
  clk:clk     = = = = = = = = = = = = = =
  1X:data     _____========_____====____
  2X          _____==_____==_____==__==_____

PARTS
  DFF XOR

OPTIONS
    FF_2IN_SYNC
    OUT_SYNCHRONOUS
    OUT_DEDICATED
```

96

AUTOMATED DESIGN SYSTEM FOR DIGITAL CIRCUITS

BACKGROUND OF THE INVENTION

Problem

Digital circuits are classified as being either combinational or sequential. A combinational type circuit consists only of logic gates (INVERTER, AND, OR) to implement a truth table or a Boolean equation. A combinational circuit has no memory or feedback paths. Its output state (logic 0 or logic 1) is completely defined by the state of its inputs regardless of the sequence of input state changes. Numerous algorithms have been developed to simplify Boolean equations. For example, the Quine-McKluskey method deals with the problem of minimizing the number of terms in a Boolean expression. See "Minimization of Boolean Functions", by E. J. McCluskey, Jr.: Bell System Tech J. Vol. 35, No. 6, 1956.

In contrast, a sequential type circuit has memory elements, generally in the form of flip-flops. Since a flip-flop can store either a logic 0 or a logic 1, a sequential circuit can have up to $2^n$ states where n is the number of flip-flops. Normally a sequential circuit also has combinational logic gates to support operation of its flip-flops. In addition, a sequential circuit may also have feedback paths that result in a circular flow of control. Any circuit with flip-flops must be designed to satisfy flip-flop timing requirements such as pulse width, setup time and hold time, and may require signal synchronization, flip-flop initialization and self-clearing functions. Because of all these additional considerations, a sequential circuit has many more possible implementations than a purely combinational circuit of a similar size, and is generally much more difficult to design and analyze.

In reference to synchronous control logic, which is a mix of combinational and clocked sequential circuits with feedback, M. Morris Mano writes: "The process of logic design is a complex undertaking. This task requires a considerable amount of experience and ingenuity on the part of the designer. See "Digital Logic and Computer Design", by M. Morris Mano: page 407, 1979. Compared to synchronous control logic, asynchronous (unclocked) control logic is yet more difficult to design and analyze, to the extent that asynchronous designs are often avoided altogether even though they offer higher speed operation than synchronous logic. See "An Engineering Approach to Digital Design", by William I. Fletcher: Chapter 6, Traditional Approaches to Sequential Design and Analysis, p. 652, 1980.

Current Techniques

Although there are many published methods to accomplish sequential logic design, there are no generalized minimization algorithms for sequential logic. "So complicated is the state assignment problem that at present there is no general technique guaranteed to yield an optimal state assignment without some sort of exhaustive search." For sequential logic design, exhaustive search approaches are generally considered impractical due to the length of time required to compute all possible circuit configurations. "If it were possible to try a new state assignment once every 100 microseconds, it would take approximately 66 years to try all the possible state assignments for a simple 16 state machine." See "An Engineering Approach to Digital Design", by William I. Fletcher: Chapter 6, Traditional Approaches to Sequential Design and Analysis, p. 367, 1980.

In practice, sequential logic design is usually done "by the seat of the pants" based on past experience. Once the designer has a good understanding of the requirements, he iterates design and analysis steps until he has a circuit that "works". The circuit is documented in the form of Boolean equations, schematic diagrams, flow charts or software-like code such as the Verilog or VHDL Hardware Description Language (HDL). For control logic, a popular design technique is to construct control flow diagrams called state diagrams to define all circuit state transitions and input/output signal dependencies. The completed state diagram is then mapped to gates and flip-flops resulting in what is referred to as a finite state machine (FSM). The state diagram approach is often helpful in mapping the requirements to a control flow model since it provides an additional level of abstraction from the schematic diagram or HDL code. However, without adequate designer discipline, state diagrams themselves can become very complex and unwieldy, and often result in extremely inefficient gate/flip-flop circuits.

Note that while there are numerous computer tools available for text editing, state diagram entry and schematic diagram capture, designing digital circuits is a manual process that requires experience, skill and a working knowledge of the integrated circuits being used.

Shortcomings

There are a number of serious shortcomings with the above-discussed digital design process. First, the designer must have experience and skill commensurate with the complexity of the circuit being designed. Next the designer must be willing to perform as many design iterations as required to achieve satisfactory results. For control logic with numerous feedback paths, even a small circuit design may take hours to complete.

Because of the lack of minimization algorithms, and the additional time and skill needed to manually simplify a circuit, there is generally little effort spent trying to minimize a control logic design. This often results in extremely complex code or schematics that are difficult (if not impossible) to fully analyze, even for the original designer. In addition, a design that is not minimal tends to have poorer performance due to longer propagation delays or additional clock periods and uses more gates and flip-flops. Unnecessary design complexity also tends to mask both functional errors and timing hazards which, unless detected by simulation or hardware prototype testing, will result in poor product producibility and reliability. Even the most careful and skilled designer can forget or overlook one or more important requirements and may not catch a dangerous race-condition glitch or a signal-synchronizing problem.

Design complexity also increases the cost of product maintenance efforts such as repair or future design changes. Design complexity can be somewhat offset by thorough design documentation of control logic implementation and requirements. In practice, however, detailed documentation of the original driving requirements and the theory of operation for the corresponding control logic are seldom written.

Need

Accordingly, there is a serious need for an automated computer tool that can support the digital design process, especially in the task of control logic design. The tool should automatically design a minimal circuit from the specified requirements. As part of its automatic circuit design process, the tool should test for functional correctness (including synchronization, flip-flop initialization and self-clearing), eliminate all timing hazards, and support rules to ensure conformance with digital design best practices. Based on the specified requirements, the tool should be able to design any logic type or mix of types: combinational, sequential, synchronous or asynchronous.

SUMMARY OF THE INVENTION

The present invention implements automatic design for all types of digital circuits (combinational, synchronous sequential, or asynchronous sequential) using basic logic-gate and flip-flop functions. A user specifies circuit requirements by defining the states of the input and output signals as either a truth table or as waveforms. A user may also specify additional circuit features such as part types and quantities, flip-flop synchronization and initialization, and glitch filtering. Guided by these user inputs and a built-in digital-design knowledge base, the invention performs a constrained exhaustive search for one or more circuit solutions that meet all the requirements (user's specifications).

Generally, exhaustive-search approaches are impractical due to the length of time required to complete a search. However, the present invention combines two synergistic features, a Start-Small-and-Increment approach and Circuit-Constraint filters, to realize high-speed search and minimal circuit design.

Start-Small-and-Increment

For each combination of parts—starting with no parts, then incrementing to one part, then incrementing to two parts, and so forth—various circuit permutations are generated. This approach, referred to as "Start-Small-and-Increment", provides several salient benefits:
1. The first solution found is guaranteed to be a minimal solution, a circuit that uses the smallest possible number of logic gates and flip-flops to meet the requirements.
2. The simpler the solution, the faster it is found. Conversely if no solution is found quickly, either the solution is a large complex circuit or there is an error in the requirement specification. At this point the user may wish to review and possibly modify the circuit specification.
3. Circuit-constraint filters leverage the knowledge that no solution exists using fewer parts than the set of parts currently under evaluation.
4. Because the circuit design is automatically designed from the user specifications, the design and its requirements are lock-stepped and fully self-documented.

Circuit-constraint Filters

Each new circuit permutation interconnects the input signals, the parts and the output signal using different wiring paths. The number of possible circuit permutations is very greatly reduced by a series of Circuit-Constraint filters, which check as much of the circuit as possible before the circuit is actually simulated. Three types of constraint checks are made: circuit requirement, digital-design rule and circuit redundancy. To the extent possible, the constraint checks are performed dynamically as the permutation is being constructed. The advantage of dynamic constraint checking is that the permutation "tree" structure can be "pruned" thus eliminating the need to check potentially large permutation branches altogether.

Logic-Design Simulator

Lastly, each circuit permutation that passes all constraint checks is tested by the Logic-Design simulator, which verifies functional operation and timing of the circuit. If the simulation also passes, the circuit is saved in the form of a schematic diagram. Because of the Start-Small-and-Increment approach, the first circuit that simulates correctly is guaranteed to be a minimal solution. The Logic-Design simulator, while having many similarities to typical design-verification simulators, has a number of unique requirements since it is a circuit design tool instead of being a circuit verification tool. The Logic-Design simulator must be extremely fast, since it may need to test thousands or tens-of-thousands of circuit permutations in the course of designing one circuit. In addition, the Logic-Design simulator must also be remarkably accurate: as a goal, it should never fail a good circuit candidate and never pass a faulty or failure-prone circuit candidate.

User Interaction and a New Paradigm

Often at the beginning of a design cycle, the user does not fully understand the problem and does not have an exact set of requirements. As work proceeds on the design, the requirements may be changed several times before they are finalized. The present invention provides the capability of being highly interactive with the user, enabling the user to incrementally adjust requirements and design parameters to find "just the right circuit". For example the user may: 1) Modify the truth table or waveforms to change the specification of the desired function, 2) Specify part types and part quantities, and 3) Specify circuit-structure options including initialization, selfclearing, synchronization and glitch removal. With this capability, the user exercises as little or as much control over the design as desired. The design process may be fully automatic using built-in default part and option parameters or the user may, for example, specify that the circuit must contain exactly two flip-flops and the output must be synchronous. In addition to allowing the user to be "in the loop", additional user specifications generally result in additional circuit constraints that in turn further reduce the search time.

Most importantly, the present invention defines a new paradigm for the digital design process. Using the conventional digital design process, the user iterates the design and refines the original requirements until a promising circuit candidate is achieved. Then the user verifies the circuit by analysis, simulation, and/or hardware prototyping. In contrast, the present invention reverses the roles of requirements and design from the perspective of the user. Using the digital design process of the present invention, the user iterates the requirements and observes the automatic circuit design and its simulation waveforms until a complete and correct set of requirements is achieved. Once this is accomplished, the design, verification and documentation steps are complete. The circuit has been automatically designed and verified by simulation, and the final requirements are documented by the waveform and option specifications. Additionally, the final circuit is guaranteed to be locked to the final requirements.

Other Embodiments

For the current implementation of the invention, circuit requirements are specified by either a truth table or signal waveforms, and the circuit solution is presented in schematic diagram form. It is understood that, in other embodiments of the present invention, requirements and solutions are presented in alternate formats such as Boolean equations, state diagrams, Hardware Description Languages or software languages such as C. It is also understood that the key concepts of this invention, highly constrained exhaustive-search filters combined with a Start-Small-and-Increment approach, may be readily applied to many other problem-solving domains. For example, the key concepts of the present invention may be applied to the design of minimized software components such as Boolean expressions and sequential state machines.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2 illustrates the signal and parts descriptions that may be included in a circuit requirement specification.

FIG. 3 lists the optional circuit characteristics that may be included in a circuit requirement specification.

FIG. 7 is an example of an asynchronous sequential circuit automatically designed by the present invention.

DETAILED DESCRIPTION OF THE INVENTION

Process Flow Diagram

Figure 1:
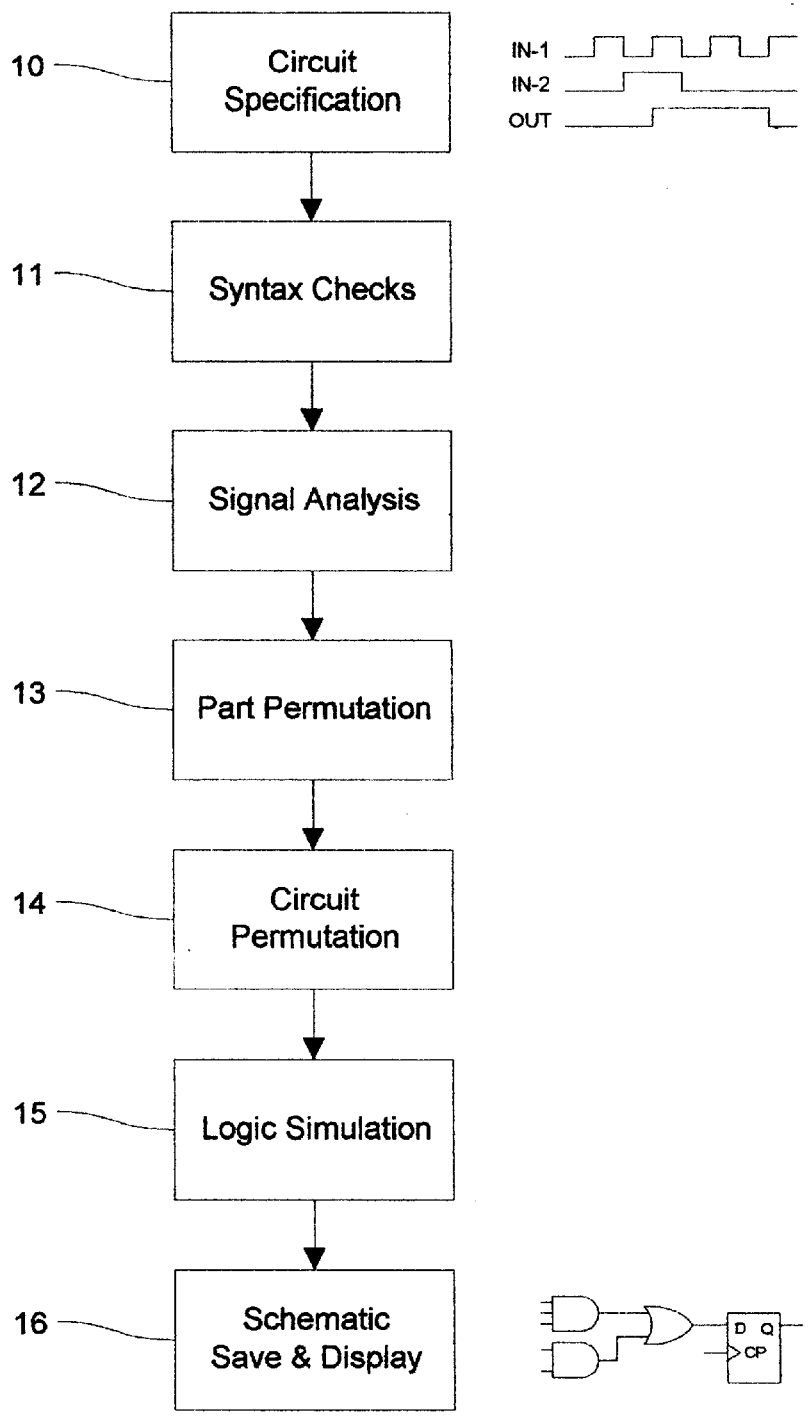
FIG. 1 is a process flow diagram showing the steps involved in the automated design process of the present invention.

FIG. 1 is a process flow diagram showing the steps involved in the automated design process of the present invention. First, the user enters requirements in the form of a circuit specification 10 at a computer terminal or workstation. Remaining steps 11–16 are performed automatically using a computer and software of the present invention to process the specification and to search for a circuit solution. Step 11 checks the specification for correct syntax to eliminate user entry errors. Step 12 analyzes the specified input/output signals of the circuit specification to determine the circuit type, combinational or sequential. Step 12 also assigns parts to be used in the design and performs consistency checks of the input/output signals. Steps 13 and 14 implement a Start-Small-and-Increment approach to generate candidate circuit permutations. Each candidate circuit is evaluated by step 15, logic simulation. If a candidate circuit simulates correctly indicating that it meets all requirements, a schematic diagram of the circuit is saved to disk memory and displayed to the user on the computer screen by step 16.

Circuit Specification

The circuit specification has three sections: In_Out_Signals, Parts and Options. FIG. 2 reference numbers 20,22 and 24 illustrate the In_Out_Signals section. The only required part of a circuit specification is the Output signal, the last signal in the In_Out_Signals section. All other specification items are optional. Note, however, that if there are no Input signals, the Output can only be a logic 0 or a logic 1. The In_Out_Signals section may be formatted either as a truth table 20 or as a list of waveforms 22. A truth table consists of signal names followed by a sequence of 0's and I's representing the logic 0 and 1 states. In a waveform list, the underscore character (_) represents a logic 0 and the equal character (=) represents a logic 1. In addition to logic 0 and logic 1 states, the x (unknown) state is allowed for Input signals, and x (don't care), r (rising edge range) and f (falling edge range) states are allowed for the Output signal. Signal Q in reference number 24 illustrates all five states: x, 0, r, 1 and f. Also shown in number 24 are the Input signal attributes :clk and :data. A :clk signal may only be used as an input to a flip-flop clock pin. In contrast, a :data signal may be used as an input to any pin except a flip-flop clock pin.

The current implementation of the invention allows a circuit to be specified with 0_N Input signals (where N is an arbitrarily large number, say 50) and exactly one Output signal. It is understood that in other embodiments of the present invention, circuits with multiple output signals may be specified and automatically designed.

FIG. 2 reference number 26 lists the part types that may be specified in the Parts section of a circuit specification. For the current implementation of the invention, ten part types are supported. For additional flexibility, AND, OR, NAND and NOR parts have a minimum of two inputs and a maximum of eight inputs. For example, one circuit may be designed with both 2-input OR gates and 5-input OR gates. If no parts are specified, default parts are assigned. For a combinational circuit, INV, AND and OR are the default parts. For a sequential circuit, INV, AND, OR and DFF_CP are the default parts. It is understood that in other embodiments of the present invention, additional part types (e.g. JK flip-flop, MULTIPLEXER, DELAY_LINE) may be supported.

FIG. 3 reference number 30 is a list of circuit design Options, the third section of a circuit specification. The first ten options, FF_2IN_SYNC through OUT_SYNCHRONOUS, add or remove constraints on the circuit being designed. For example, FF_2IN_SYNC constrains DFF parts such that only :clk type signals can be connected to a DFF's clock pin, while GATE_LATCH_ALLWD removes the constraint of disallowing asynchronous feedback. The four SOLUTION options allow the user to obtain a single circuit solution or to obtain multiple solutions from which the user can select the best fit for a particular application. The SOLUTION_FIRST option stops the automatic design process after the first circuit solution is found. SOLUTION_SIMPLE, SOLUTION_EQUIV and SOLUTION_ALL continue searching after the first circuit solution is found, but constrain subsequent circuit solutions based on previous solutions found as described in 30 (FIG. 3). The current mechanization of the invention provides four truth-table/waveform display options. Refer to the WAVEFORM_01/2/3 descriptions in 30 (FIG. 3).

Syntax Checks

Before beginning a search for a circuit solution, the circuit specification is checked for correct syntax and element dependencies (step 11, FIG. 1). This is a simple means to eliminate certain types of user errors and hence prevent the waste of search time in the event of an incorrect specification. Syntax checks 11 cover all three sections of the circuit specification: In_Out_Signals 20,22,24, Parts 26 and Options 30 of FIG. 2 and FIG. 3. Signal syntax errors include duplicate signal names, duplicate truth-table or waveform patterns, pattern lengths unequal to the Output pattern length, illegal signal state usage, and undefined signal attributes or states. For example, 'x' signal states are not allowed for clock signals and a 'z' signal state is undefined for the preferred embodiment of the present invention. Part syntax errors include undefined part types and out-of-range input counts. For example, XR is an undefined part type and XOR3, a 3-input XOR gate, is out-of-range per Parts section 26 of FIG. 2. Similarly, Option syntax errors include undefined or conflicting Options. For example, SOLUTION_FIRST conflicts with SOLUTION_ALL as defined in Options list 30 of FIG. 3.

Signal Analysis

Figure 4:
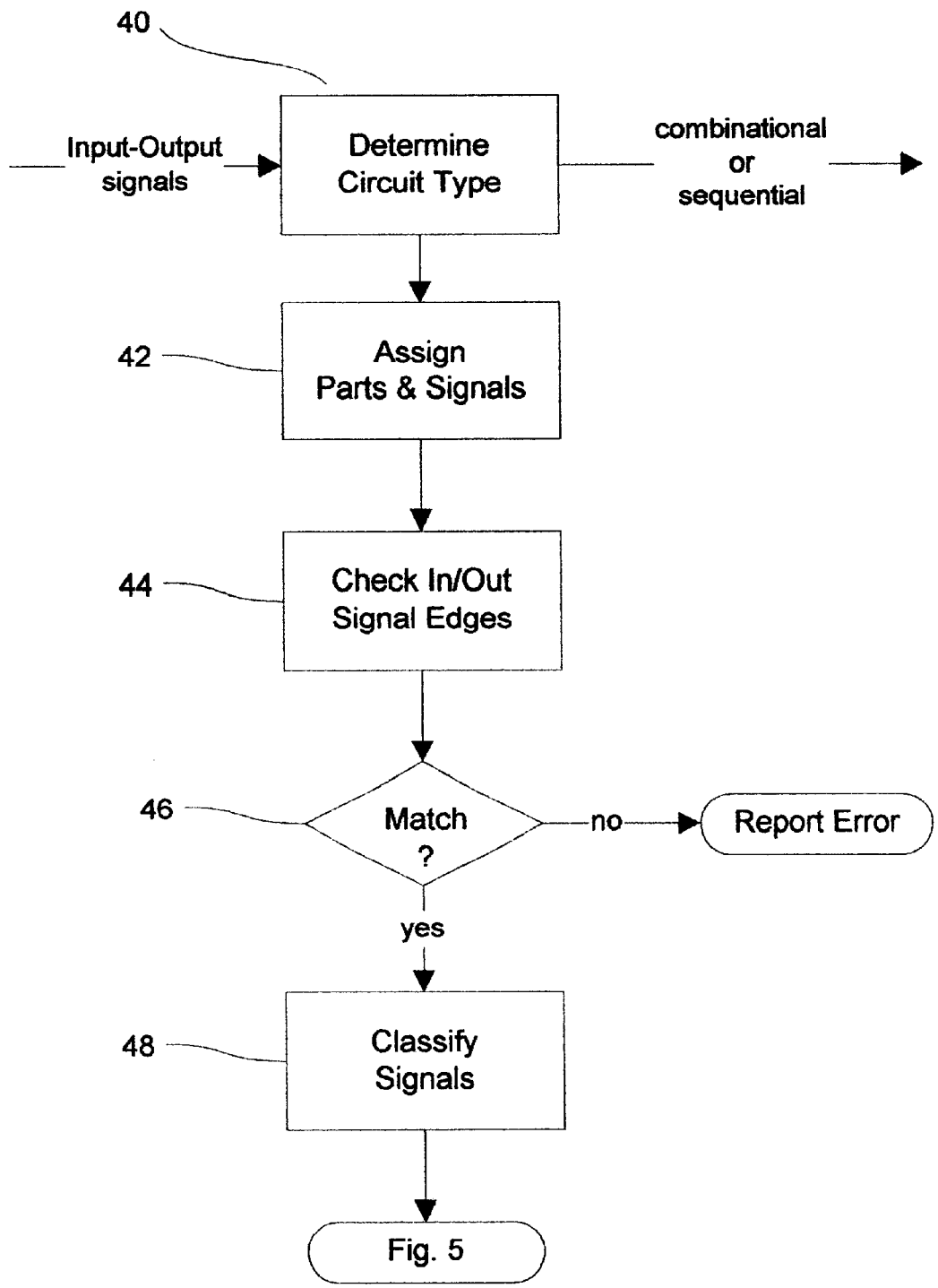
FIG. 4 is a flow diagram showing the steps involved in the signal analysis step of FIG. 1.

FIG. 4 is a flow diagram showing the sequence of operations used to analyze 12 (FIG. 1) the Input and Output signals. The principal function of this analysis 12 is to determine whether the circuit is combinational or sequential 40, and consequently whether flip-flops, latches and :clk signals are appropriate for the design. The basic combinational-sequential algorithm is as follows: If identical input signal states correspond to different output states, then memory is required and the circuit is sequential. Otherwise the circuit is combinational.

Once the circuit type is determined at 49, parts and signals are assigned 42. If no parts are specified, default part types are assigned as described above in the description of Parts section 26 (FIG. 2). Parts that have been specified are assigned per the subject specification except that flip-flops are omitted in the case of a combinational circuit. Similarly, :clk signals and sequential circuit options such as FF_2IN_SYNC are omitted if the circuit is combinational. In the next step 44, Input and Output signals are checked for corresponding edges. For every Output signal state change, there must be one or more Input signal state changes. If Input edges are missing, a specification error report 46 is issued to the user and the design process is terminated.

The last step of FIG. 4 is to classify signals 48 as to their relative necessity to the design. For example, if an Input signal is all logic 0's, it is not needed at all. In contrast, if a :clk type signal is needed and only one Input signal is a :clk type, then that Input signal is a necessary part of the design. Additional necessity criteria can be derived based on the Input/Output signal edge dependencies discussed above, in step 44.

Permutations

Figure 5:
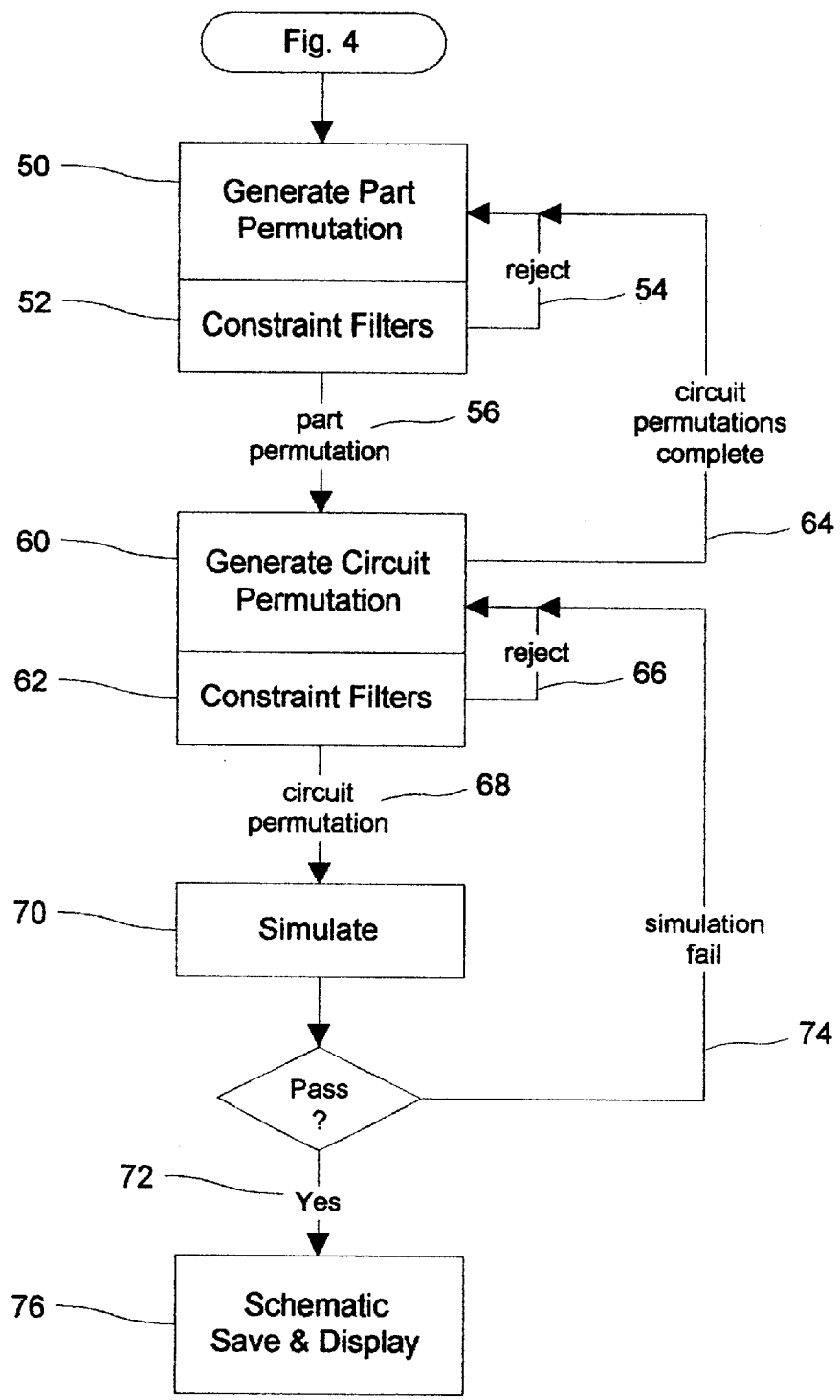
FIG. 5 is a flow diagram showing details of the FIG. I steps followed to generate permutations, simulate logic and produce a circuit schematic.

The upper half of FIG. 5 is a flow diagram that shows the steps followed to generate part permutations and circuit permutations. These permutations are generated by a "Start-Small-and-Increment" approach. For each combination of parts—starting with no parts, then incrementing to one part, then incrementing to two parts, and so forth—various circuit permutations are generated. This approach provides several salient benefits:
1. The first solution found is guaranteed to be a minimal solution, a circuit that uses the smallest possible number of logic gates and flip-flops to meet the requirements.
2. The simpler the solution, the faster it is found. Conversely if no solution is found quickly, either the solution is a large complex circuit or there is an error in the requirement specification 10 (FIG. 1). At this point the user may wish to review and possibly modify the circuit specification 10.
3. Circuit-constraint filters are able to leverage the knowledge that no solution exists using fewer parts than the set of parts currently under evaluation.
4. Because the circuit design is automatically designed from the user specifications 10, the design and its requirements are lock-stepped and fully self-documented.

Part Permutation

As a first step, a part permutation 50 is generated. Next, constraint filters 52 check that the part permutation is not redundant with previous permutations and is compatible with the circuit specification 10. This is accomplished by a series of five part constraint checks:
1. Redundant permutation—For example, (INV, AND) is redundant with(AND, INV) and is not allowed.
2. Sufficient parts—For example, at least one flip-flop is needed for a synchronous design.
3. Excessive parts—For example, with two input signals and one AND gate, no more than three INV parts are needed.
4. Specified part counts—For example, if AND=2–4 is specified, the number of AND gates must be between 2 and 4.
5. Solution Simple/Equivalent criteria. Refer to FIG. 3 number 30. Referring back to FIG. 5, if the part permutation is rejected 54 by any part constraint filter 52, the next part permutation is generated. Otherwise the current part permutation is passed 56 to the Circuit Permutation block 60.

Circuit Permutation

Starting with a part permutation, circuit permutations are generated 60 and filtered 62 in a similar manner as part permutations. However, the circuit constraint filters 62 check the circuit structure instead of the mix of parts. Three types of circuit constraint checks are made: circuit specification, digital-design rule and circuit redundancy. To the extent possible, these constraint checks are performed dynamically as the permutation is being constructed. The advantage of dynamic constraint checking is that the permutation "tree" stricture is able to be "pruned" thus eliminating the need to check potentially large permutation branches altogether. The following circuit constraint checks are performed:
1. Signal attribute (:clk, :data) specification. See description of In_Out_Signal section 24 above.
2. Option specifications 30—See FIG. 3, description of options FF_2IN_SYNC through OUT_SYNCHRONOUS.
3. Input signals that are required per signal analysis 48 (FIG. 4) must be included in the circuit.
4. Self-feedback. A part cannot drive its own input pins.
5. Double inversion. A circuit cannot have two INV parts in series.
6. Redundant permutation and mirror image permutations are not allowed. For example, if a 2-input AND has signals A and B applied to pins 1 and 2, the reverse order B and A applied to pins 1 and 2 has the identical effect and is not allowed.
7. Redundant inputs. A circuit cannot have a part with repeated input signals.

For example, a 2-input AND with signal A applied to both pins 1 and 2 is not allowed. If the circuit permutation is rejected 66 by any constraint filter 62, the next circuit permutation is generated. When all possible circuit permutations have been generated, constraint tested and failed loop 64 enables a part to be added on following the part permutation routine 50,52 discussed above. Otherwise the current circuit permutation is passed 68 to the Simulate block 70.

Logic Simulation

Each circuit permutation that passes all circuit constraint checks 62 is tested by a logic simulator 70, which verifies functional operation and timing of the circuit. The simulator, while having many similarities to typical design-verification simulators, has certain unique requirements since it is a circuit design tool instead of being a circuit verification tool. The simulator must be extremely fast, since it may need to test thousands or tens-of-thousands of circuit permutations in the course of designing one circuit. In addition, the simulator must also be remarkably accurate: as a goal, it should never fail a good circuit candidate and should never pass a faulty or failure-prone circuit candidate. To this end, the logic simulator also checks for circuit race conditions, glitches and oscillation.

For reasons of simplicity and speed, the simulator is a unit-time-delay simulator. That is, instead of assigning distinct delay values to each part type (for example 5 nanoseconds for an INV and 10 nano-seconds for a DFF), the delay of each part is considered identical. It is understood that in other embodiments of the present invention, the capability to specify distinct delay values to each part and to each interconnect wire may be provided.

All flip-flop parts (DFF, DFF_C, DFF_CP) operate like the classic TTL 7474 D-type flip-flop. Refer to "An Engineering Approach to Digital Design", by William I. Fletcher, p. 322–327, 1980. The D flip-flops are positive edge-triggered, that is they change state when the clock input rises from a logic 0 to a logic 1. The optional clear (C) and preset (P) inputs are active at a logic 0 level. The flip-flops require a positive amount of Setup Time, that is the D input must be stable at least one time tic before the clock rises. Similarly the C and P inputs must be inactive (Release Time) for at least one time tic before the clock rises. One time tic is defined as the time from one waveform 0/1/x/r/f character to the next. Flip-flop parts also require at least "0" Hold Time, that is the D input must not change until the clock rises. To meet this Hold Time requirement, the D input may change simultaneously with the clock but it may not change even one gate-delay before the clock rises. Any Setup, Release, or Hold Time violation results in a flip-flop going to the 'x' state.

The simulator determines the state of the circuit output, one time tic at a time, for each state of the specified Input and Output signals. If, at any time tic, the circuit output does not match the specified Output signal, the simulator is stopped, a simulation fail result 74 is issued and a new circuit permutation is requested. However, if the circuit output meets the entire Output signal specification, the simulation passes 72 and the circuit is saved to a file and displayed to the user in the form of a schematic diagram 76.

Circuit Examples

Figure 6:
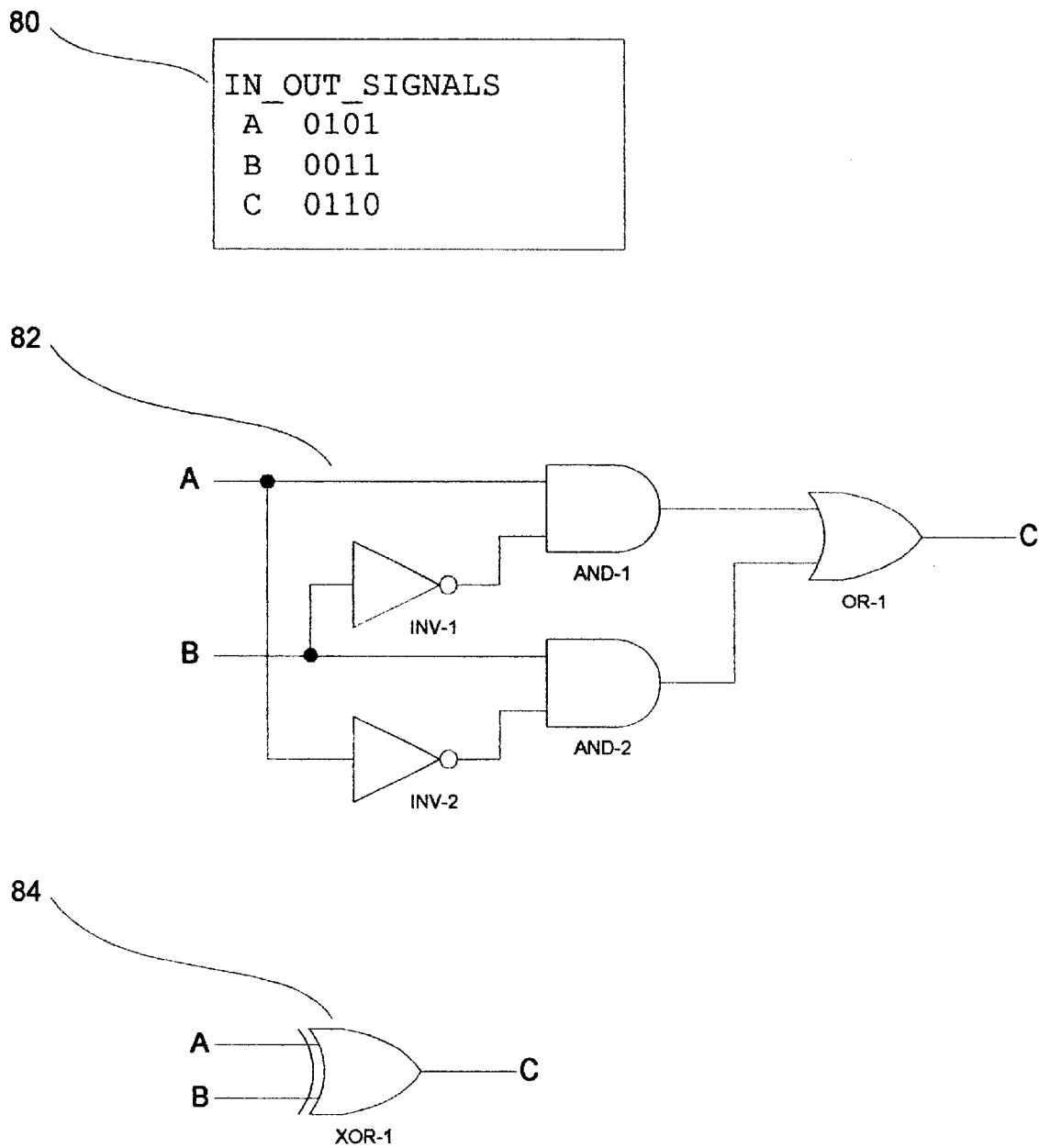
FIG. 6 is an example of combinational circuits automatically designed by the present invention.

FIG. 6 is an example of a combinational circuit specification 80 for an Exclusive OR and two equivalent circuits that were automatically designed by the present invention. If no parts are specified, the set of default parts (INV, AND, OR) is assigned and resulting circuit 82 is designed. This design uses the minimum possible number of INV, AND, OR parts needed to mechanize the specified function, an Exclusive OR. If, on the other hand, "PARTS XOR" is specified, resulting circuit 84 is designed using a single XOR gate.

FIG. 7 is an example of a specification 90 for an asynchronous sequential circuit, a transparent latch, using NAND parts. The resulting minimal circuit 92 that was automatically designed by the present invention uses only four NAND gates and includes an R-S latch flip-flop, NAND-3 and NAND-4.

Figure 8:
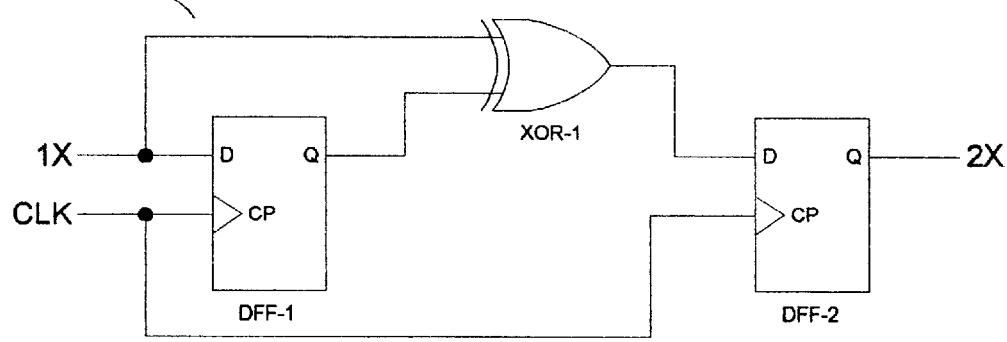
FIG. 8 is an example of a synchronous sequential circuit automatically designed by the present invention.

FIG. 8 is an example of a specification 94 for a synchronous sequential circuit using DFF and XOR parts. Three options, FF_2IN_SYNC, OUT_SYNCHRONOUS and OUT_DEDICATED, are also specified. In summary, the specified circuit 94 is required to be a frequency doubler (2X) and to generate one pulse for each rising and each falling edge of the 1X input. In addition, the DFF parts are required to be synchronized (:clk signal connected to clock pin), the output is required to be synchronous (a DFF), and the output must be dedicated, that is the output cannot connect to inputs of other parts. Resulting circuit 96 that was automatically designed by the present invention meets all of these requirements and uses a minimum number of parts.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A computer method for designing a solution to a problem in a specific domain, the solution formed of at least one component from a given plurality of components, the method comprising the steps of:

(a) in a digital processor, receiving a representation of problem inputs and a representation of a desired output;

(b) using the digital processor, constructing a candidate minimal solution to the problem by incrementally considering the candidate minimal solution via selecting components from the given plurality and ordering combinations of the selected components, said constructing using constraints to narrow selection and combination of components;

(c) evaluating the candidate solution, resulting in a candidate output when the candidate solution matches the desired output; and (d) outputting the candidate output, resulting in a simplest solution.

2. The method of claim 1 wherein;

the specific domain is digital logic circuit design;

the given plurality of components include logic gates and flip flops; and the problem inputs and the desired output are represented by truth tables or waveforms.

3. The method of claim 2 wherein the evaluating step employs a logic circuit simulator.

4. The method of claim 2 wherein the evaluating step further includes for each candidate solution constructed in Step (b), evaluating the candidate solution to determine whether the candidate solution matches the desired output, where a candidate solution is an ill match continuing one candidate solution after another determining whether one other candidate solution matches the desired output.

5. The method of claim 2 wherein the outputting step represents the simplest solution in a high level design language including hardware description language.

6. The method of claim 2 wherein the outputting step represents the simplest solution in a set of Boolean Equations.

7. The method of claim 2 wherein the outputting step represents the simplest solution in a schematic diagram.

8. The method of claim 2 wherein the digital logic circuit design includes:
   combinatorial, sequential, synchronous and asynchronous circuit designs.

9. In a digital processor, computer apparatus for automatically designing a digital logic circuit comprising:
   a receiver receiving a representation of problem inputs of a problem of interest and a representation of a desired output in truth tables or waveform format;
   a circuit constructor coupled to the receiver for constructing a candidate minimal solution to the problem by incrementally considering the candidate minimal solution via selection and ordered combination of components from a set of predefined digital component representations;
   a logic circuit evaluator responsive to the circuit constructor, the logic circuit evaluator evaluating the candidate solution, where if the candidate solution matches the desired output, the logic circuit evaluator provides a candidate output; and
   an output unit outputting the candidate solution in a schematic diagram, resulting in a simplest solution.

10. Computer apparatus as claimed in claim 9 wherein the circuit constructor employs constraining filters to narrow selection and combination of components.

11. Computer apparatus as claimed in claim 9 wherein the logic circuit evaluator employs a logic circuit simulator for simulating the candidate solution.

12. Computer apparatus as claimed in claim 9 wherein the circuit constructor and logic circuit evaluator are responsive to each other such that the circuit constructor constructs a first candidate minimal solution and the logic circuit evaluator evaluates the first candidate minimal solution, where if the logic circuit evaluator determines an insufficient match between the first candidate minimal solution and desired output, the circuit constructor constructs, one at a time, successive candidate minimal solutions by incrementally constructing and considering successive candidate minimal solutions, and the logic circuit evaluator evaluates each successive candidate minimal solution until a match to the desired output is achieved, the logic circuit providing the candidate solution achieving the match as the candidate output.

13. Computer apparatus as claimed in claim 9 wherein the output unit further outputs the candidate output expressed in terms of a high level design language including hardware description language.

14. Computer apparatus as claimed in claim 9 wherein the output unit further represents the candidate output in a set of Boolean equations.

15. Computer apparatus as claimed in claim 9 wherein the components include logic gates and flip-flops, and the digital logic circuit design includes combinatorial, sequential, synchronous, and asynchronous circuit designs.

16. A computer program embodied on a computer-readable medium for automatically designing a digital logic circuit comprising:
   a receiver segment receiving a representation of problem inputs and a representation of a desired output in truth tables or waveform format;
   a circuit constructor segment constructing a candidate minimal solution to the problem by incrementally considering the candidate minimal solution via selection and ordered combination of components from a set of predefined digital component representations, using constraint filters to narrow the set of candidate minimal solutions;
   a logic circuit evaluator segment evaluating the candidate minimal solution, where if the logic circuit evaluator segment determines that the candidate minimal solution matches the desired output, the logic circuit evaluator provides a candidate output; and
   an output segment outputting the candidate solution in at least one of a schematic diagram, Boolean equations, a high level design language and a hardware description language, resulting in a simplest solution.

17. A computer program as claimed in claim 16 wherein the components include flip-flops and logic gates.

18. A computer program as claimed in claim 16 wherein the digital logic circuit design includes combinatorial, sequential, synchronous and asynchronous circuit designs.

* * * * *